United States Patent
Hsu et al.

(10) Patent No.: US 8,667,348 B2
(45) Date of Patent: Mar. 4, 2014

(54) DATA WRITING METHOD FOR NON-VOLATILE MEMORY MODULE AND MEMORY CONTROLLER AND MEMORY STORAGE APPARATUS USING THE SAME

(75) Inventors: Nien-Hao Hsu, Hsinchu (TW); Tsai-Fu Yen, Hsinchu (TW); Chee-Shyong Aw-Yong, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 246 days.

(21) Appl. No.: 13/091,155

(22) Filed: Apr. 21, 2011

(65) Prior Publication Data

US 2012/0185740 A1  Jul. 19, 2012

(30) Foreign Application Priority Data

Jan. 19, 2011 (TW) ............................ 100101974 A

(51) Int. Cl.
*G11C 29/00* (2006.01)

(52) U.S. Cl.
USPC .......................................... 714/723

(58) Field of Classification Search
None
See application file for complete search history.

(56) References Cited

U.S. PATENT DOCUMENTS

| | | | | |
|---|---|---|---|---|
| 7,945,826 B2 * | 5/2011 | Kameda et al. | ............... | 714/723 |
| 7,984,345 B2 * | 7/2011 | Ozawa et al. | ................. | 714/723 |
| 2001/0032327 A1 * | 10/2001 | Lin | ............................... | 714/723 |
| 2002/0157048 A1 * | 10/2002 | Roohparvar | .................. | 714/723 |
| 2007/0109856 A1 * | 5/2007 | Pellicone et al. | ......... | 365/185.09 |
| 2008/0052015 A1 * | 2/2008 | Ozawa et al. | ................... | 702/57 |
| 2009/0040825 A1 * | 2/2009 | Adusumilli et al. | ...... | 365/185.09 |
| 2009/0049351 A1 * | 2/2009 | Norrod et al. | ................. | 714/723 |
| 2009/0137070 A1 * | 5/2009 | Co et al. | .......................... | 438/17 |
| 2009/0287956 A1 * | 11/2009 | Flynn et al. | ....................... | 714/6 |
| 2010/0107022 A1 * | 4/2010 | Bottelli et al. | ............... | 714/723 |
| 2011/0002169 A1 * | 1/2011 | Li et al. | .................... | 365/185.09 |
| 2011/0219259 A1 * | 9/2011 | Frost et al. | ..................... | 714/6.2 |

* cited by examiner

Primary Examiner — Guerrier Merant
(74) *Attorney, Agent, or Firm* — Jianq Chyun IP Office

(57) ABSTRACT

A data writing method for a re-writable non-volatile memory module and a memory controller and a memory storage apparatus using the same are provided, wherein the re-writable non-volatile memory module has a plurality of physical writing units, and each of the physical writing units has a plurality of physical writing segments. The data writing method includes identifying at least one non-used segment among the physical writing segments of each of the physical writing units and writing a plurality of segment data streams into the physical writing units, wherein the non-used segments of the physical writing units are not used for writing the segment data. Accordingly, the data writing method can effectively use normal physical writing segments in the physical writing units.

20 Claims, 9 Drawing Sheets

DATA WRITING METHOD FOR NON-VOLATILE MEMORY MODULE AND MEMORY CONTROLLER AND MEMORY STORAGE APPARATUS USING THE SAME

CROSS-REFERENCE TO RELATED APPLICATION

This application claims the priority benefit of Taiwan application serial no. 100101974, filed on Jan. 19, 2011. The entirety of the above-mentioned patent application is hereby incorporated by reference herein and made a part of this specification.

BACKGROUND

1. Technology Field

The invention generally relates to a data writing method, and more particularly, to a data writing method for a non-volatile memory module with a large number of bad physical blocks and a memory controller and a memory storage apparatus using the same.

2. Description of Related Art

Rewritable non-volatile memory is one of the most adaptable storage media to electronic devices due to its characteristics such as data non-volatility, low power consumption, small volume, non-mechanical structure, and high access speed. A solid state drive (SSD) is a storage device which uses a NAND flash memory as its storage medium. Flash memory has broadly adopted for storing important personal data thanks to its small volume and large storage capacity. Thereby, the flash memory industry has become a very important part of the electronic industry in recent years.

Generally speaking, in a rewritable non-volatile memory storage apparatus, the physical blocks in the re-writable non-volatile memory module are logically grouped by the memory controller into a data area, a free area, a system area, and a replacement area.

The physical blocks in the data area have stored data and the physical blocks in the free area are used for substituting the physical blocks in the data area when the write commands are executed. To be specific, when a rewritable non-volatile memory storage apparatus receives a write command from a host system and is about to update data in a physical block of the data area, the rewritable non-volatile memory storage apparatus selects a physical block from the free area, writes the valid old data stored in the physical block to be updated in the data area and the new data into the physical block selected from the free area, associates the physical block containing the new data with the data area, and erases the original physical block in the data area and associates the erased physical block with the free area. In order to allow the host system to successfully access the physical blocks that are alternatively used for storing data, the rewritable non-volatile memory storage apparatus configures logical sectors to be accessed by the host system, wherein the logical sectors are grouped into a plurality of logical pages, and the logical pages are grouped into a plurality of logical block. In particular, the rewritable non-volatile memory storage apparatus establishes a logical block-physical block mapping table and records and updates the mapping relationship between the logical blocks and the physical blocks of the data area in the logical block-physical block mapping table, so as to reflect the alternation of the physical blocks. Accordingly, the host system simply accesses the logical sectors, while the rewritable non-volatile memory storage apparatus actually reads data from or writes data into the corresponding physical blocks according to the logical block-physical block mapping table.

The physical blocks in the system area are used for storing important information related to the rewritable non-volatile memory storage apparatus, and the physical blocks in the replacement area are used for replacing damaged physical blocks (i.e., bad physical blocks) in the system area, the data area, or the free area. To be specific, in an existing block management technique, when data written into a physical page or a physical sector of a physical block contains error bits that cannot be corrected through an error checking and correcting procedure, the physical block is marked as a bad physical block, and the memory controller selects a physical block from the replacement area to replace the bad physical block. In addition, when there are not enough normal physical blocks in the re-writable non-volatile memory module for writing data in the alternative manner described above, the rewritable non-volatile memory storage apparatus can no longer be used for writing data.

Due to the limitation in the manufacturing process, some physical sectors of physical blocks of a re-writable non-volatile memory module may have defects therefore cannot be used for storing data. These physical blocks are identified as bad physical blocks and will not be used. In particular, if a rewritable non-volatile memory storage apparatus cannot work properly due to the large number of bad physical blocks therein, the re-writable non-volatile memory module is considered a defective and unusable product. However, in fact, there is still a large quantity of normal storage space that can be used for storing data in such bad physical blocks. Thus, the re-writable non-volatile memory module that is considered as defective product during the manufacturing process can be reused if these defective physical blocks can be effectively used.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention is directed to a data writing method and a memory controller and a memory storage apparatus using the same, wherein the normal storage space in physical blocks can be effectively used.

According to an exemplary embodiment of the invention, a data writing method for a re-writable non-volatile memory module is provided, wherein the re-writable non-volatile memory module has a data area and a free area. The data area is used for storing data, and the free area is used for writing data and substituting the data area. The free area has a plurality of physical writing units, and each of the physical writing units includes a data bit area and a redundant bit area, wherein the data bit area includes a plurality of physical writing segments. The data writing method includes identifying at least one non-used segment among the physical writing segments of each of the physical writing units and writing a plurality of segment data streams into the physical writing units, wherein the non-used segments of the physical writing units are not used for writing the segment data.

According to an exemplary embodiment of the invention, a data writing method for a re-writable non-volatile memory module is provided, wherein the re-writable non-volatile memory module has a plurality of physical blocks, each of the physical blocks has a plurality of physical pages, each of the physical pages includes a data bit area and a redundant bit area, and each of the data bit areas includes a plurality of physical sectors. The data writing method includes identifies at least one non-used sector among the physical sectors in the data bit area of each of the physical pages and writing a plurality of sectir data streams into a first physical page among the physical pages in unit of each physical page, wherein the non-used sector among the physical sectors in the data bit area of the first physical page is not used for writing the sector data.

According to an exemplary embodiment of the invention, a memory controller for controlling a re-writable non-volatile memory module is provided, wherein the re-writable non-volatile memory module has a plurality of physical blocks, each of the physical blocks has a plurality of physical pages, each of the physical pages includes a data bit area and a redundant bit area, and each of the data bit areas includes a plurality of physical sectors. The memory controller includes a host interface, a memory interface, and a memory management circuit. The host interface is configured for coupling to a host system, the memory interface is configured for coupling to the re-writable non-volatile memory module, and the memory management circuit is coupled to the host interface and the memory interface. The memory management circuit identifies at least one non-used sector among the physical sectors in the data bit area of each of the physical pages and writes a plurality of sector data streams into a first physical page among the physical pages in unit of each physical page, wherein the non-used sector among the physical sectors in the data bit area of the first physical page is not used for writing the sector data.

According to an exemplary embodiment of the invention, a memory storage apparatus including a connector, a re-writable non-volatile memory module, and a memory controller is provided. The connector is configured for coupling to a host system. The re-writable non-volatile memory module has a plurality of physical blocks, wherein each of the physical blocks has a plurality of physical pages, each of the physical pages includes a data bit area and a redundant bit area, and each of the data bit areas includes a plurality of physical sectors. The memory controller is coupled to the connector and the re-writable non-volatile memory module. The memory controller identifies at least one non-used sector among the physical sectors in the data bit area of each of the physical pages. Besides, the memory controller further writes a plurality of sector data streams into a first physical page among the physical pages in unit of each physical page, wherein the non-used sector among the physical sectors in the data bit area of the first physical page is not used for writing the sector data.

As described above, exemplary embodiments of the invention provide a data writing method and a memory controller and a memory storage apparatus using the same, wherein normal physical sectors in a re-writable non-volatile memory module can be effectively used.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
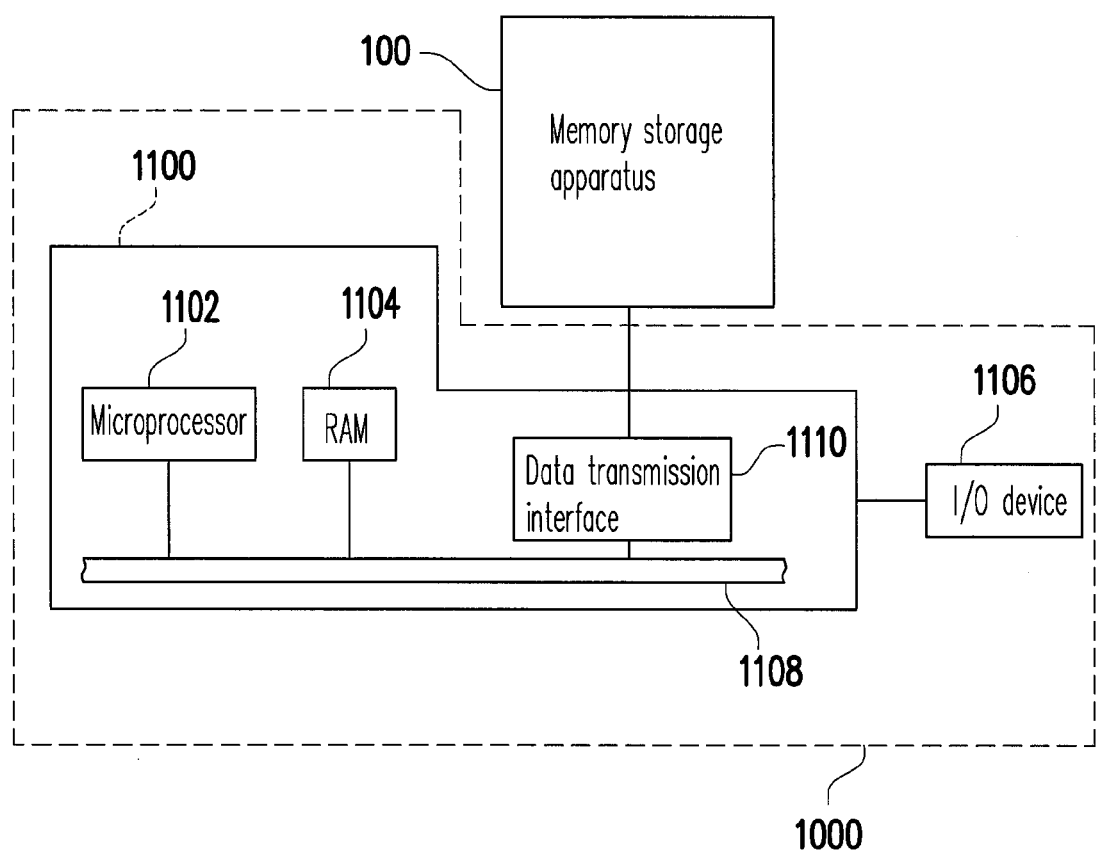
FIG. 1A illustrates a host system and a memory storage apparatus according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Regarding the management of a re-writable non-volatile memory module, the physical writing units of the re-writable non-volatile memory module are grouped into a data area and a free area, wherein the physical writing units in the data area are used for storing data, and the physical writing units in the free area are used for writing data and substituting the physical writing units in the data area. In addition, each physical writing unit includes a data bit area and a redundant bit area, wherein the data bit area includes a plurality of physical writing segments. In a data writing method provided by the invention, at least one non-used physical writing segment (referred to as a non-used segment thereinafter) is identified among the physical writing segments of each physical writing unit, and when segment data is written into each physical writing unit, the non-used segment of the physical writing unit is not used for writing the segment data. Accordingly, the capacity of each logical writing unit accessed by the host system is equal to the capacity of each physical writing unit minus the capacity of the non-used segment of the physical writing unit.

To be specific, in the data writing method provided by the invention, test data is written into the physical writing segments in the data bit areas of a plurality of test physical writing units among the physical writing units. Thereafter, damaged physical writing segments among the physical writing segments containing the test data stream are identified through an error checking and correcting procedure, and a distribution status of the damaged physical writing segments in the test physical writing units is determined to generate a damaged segment distribution table. After that, the non-used segment among the physical writing segments of each physical writing unit is identified according to the damaged segment distribution table. In the present exemplary embodiment, the non-used segments among the physical writing segments of the physical writing units are the same. Namely, for the convenience of management, the non-used segments of some physical writing units may be good physical writing segments but are not used for writing valid data, and bad segment information of the non-used segment among the physical writing segments of each physical writing unit is stored in one of the physical writing units. Accordingly, every time when a write command is executed, the non-used segment of each physical writing unit is skipped (i.e., not used for writing segment data) according to the bad segment information. Thereby, at least some of the normal physical writing segments in the re-writable non-volatile memory module can still be used for storing data.

In the invention, the physical (logical) writing units may be physical (logical) blocks, physical (logical) pages, or any other suitable units, wherein a data bit area may be a data bit area in a single page or composed of the data bit areas in several pages, and a redundant bit area may also be a redundant bit area in a single page or composed of the redundant bit areas in several pages. Below, the invention will be further explained by referring to an exemplary embodiment and accompanying drawings. In the present exemplary embodiment, the physical writing units are physical pages of the re-writable non-volatile memory module, the physical writing segments are physical sectors of the re-writable non-volatile memory module, and the segment data is sector data. However, the invention is not limited thereto.

FIG. 1A illustrates a host system and a memory storage apparatus according to an exemplary embodiment of the invention.

Figure 1B:
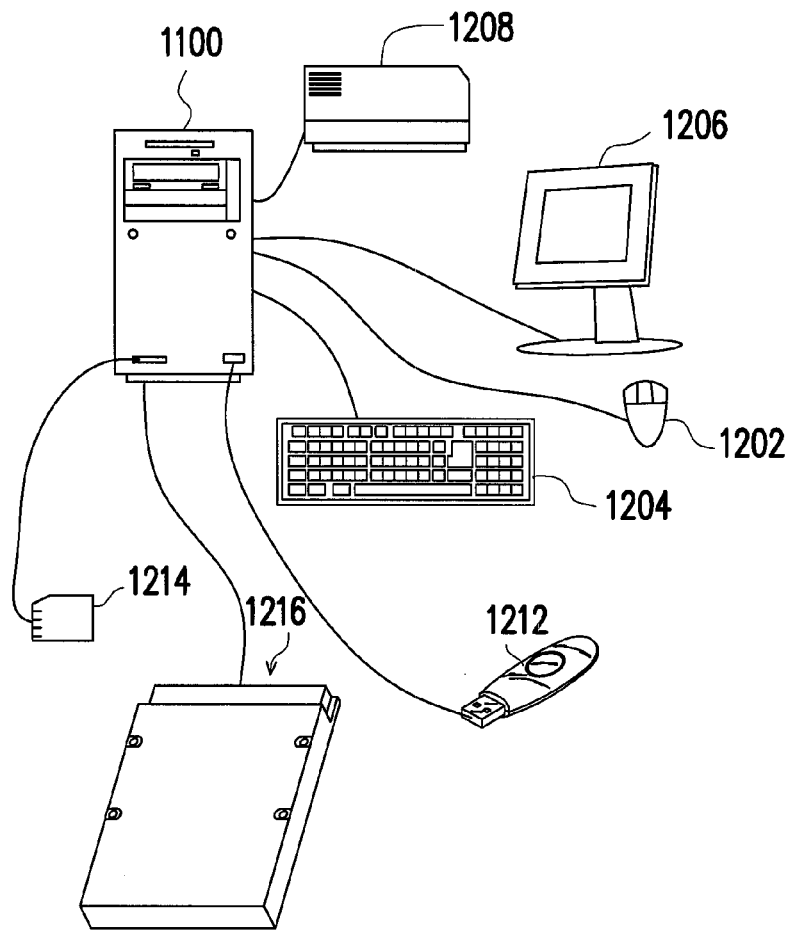
FIG. 1B is a diagram of a computer, input/output (I/O) devices, and a memory storage apparatus according to an exemplary embodiment of the invention.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the I/O device 1106 is not limited to the devices illustrated in FIG. 1B and may further include other devices.

In the present embodiment, a memory storage apparatus 100 is coupled to other components of the host system 1000 through the data transmission interface 1110. Through the operations of the microprocessor 1102, the RAM 1104, and the I/O device 1106, data can be written into or read from the memory storage apparatus 100. For example, the memory storage apparatus 100 may be a rewritable non-volatile memory storage apparatus, such as the flash drive 1212, the memory card 1214, or the solid state drive (SSD) 1216 illustrated in FIG. 1B.

Figure 1C:
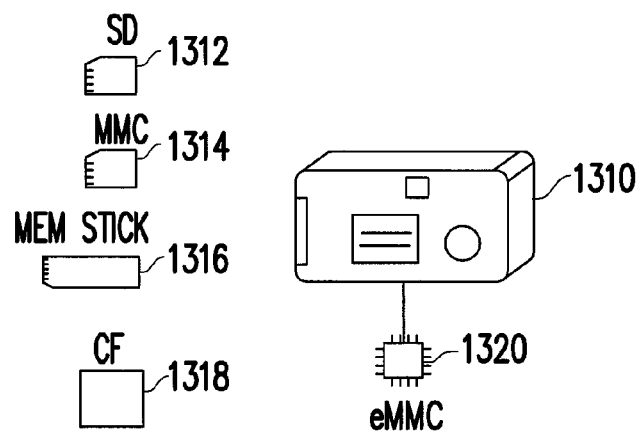
FIG. 1C is a diagram of a host system and a memory storage apparatus according to another exemplary embodiment of the invention.

Generally speaking, the host system 1000 may be substantially any system that works with the memory storage apparatus 100 to store data. Even though the host system 1000 is described as a computer system in the present exemplary embodiment, in another exemplary embodiment of the invention, the host system 1000 may also be a digital camera, a video camera, a communication device, an audio player, or a video player. For example, if the host system is a digital camera (video camera) 1310, the rewritable non-volatile memory storage apparatus is then a secure digital (SD) card 1312, a multi media card (MMC) 1314, a memory stick (MS) 1316, a compact flash (CF) card 1318, or an embedded storage device 1320 (as shown in FIG. 1C) used by the digital camera (video camera) 1310. Herein the embedded storage device 1320 includes an embedded MMC (eMMC). It should be mentioned that the eMMC is directly coupled to the motherboard of the host system.

Figures 2, 3:
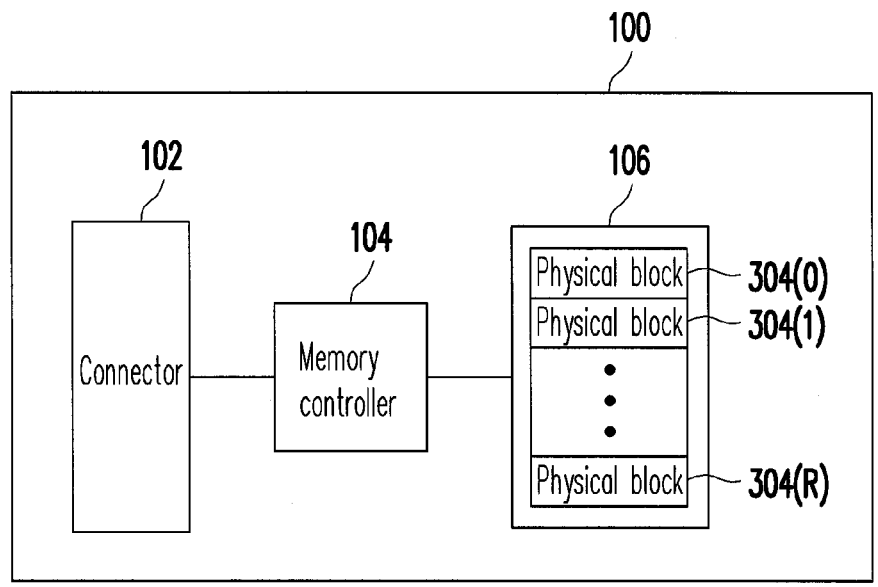
FIG. 2 is a schematic block diagram of the memory storage apparatus in FIG. 1A.
FIG. 3 is a diagram illustrating data bit areas in a physical block according to an exemplary embodiment of the invention.

FIG. 2 is a schematic block diagram of the memory storage apparatus in FIG. 1A.

Referring to FIG. 2, the memory storage apparatus 100 includes a connector 102, a memory controller 104, and a re-writable non-volatile memory module 106.

In the present exemplary embodiment, the connector 102 complies with the serial advanced technology attachment (SATA) standard. However, the invention is not limited thereto, and the connector 102 may also complies with the Institute of Electrical and Electronic Engineers (IEEE) 1394 standard, the peripheral component interconnect (PCI) express standard, the universal serial bus (USB) standard, the SD interface standard, the MS interface standard, the MMC interface standard, the CF interface standard, the integrated device electronics (IDE) standard, or any other suitable standard.

The memory controller 104 executes a plurality of logic gates or control instructions implemented in a hardware or firmware form and performs various data operations on the re-writable non-volatile memory module 106 according to commands of the host system 1000.

The re-writable non-volatile memory module 106 is coupled to the memory controller 104 and configured to store data written by the host system 1000. The re-writable non-volatile memory module 106 has a plurality of physical blocks (i.e., the physical blocks 304(0)-304(R)). In the present exemplary embodiment, R is (2048-1). Namely, the re-writable non-volatile memory module 106 has 2048 physical blocks. However, the invention is not limited thereto, and in another exemplary embodiment of the invention, R may be any number greater than 0. Herein the physical blocks may belong to the same memory die or different memory dies.

FIG. 3 is a diagram illustrating data bit areas in a physical block according to an exemplary embodiment of the invention. Since the physical blocks have the same structure, only a physical block 304(0) is illustrated herein as an example.

Referring to FIG. 3, the physical block 304(0) has sequentially arranged physical pages PP(0)-PP(127), and each of the physical pages has sequentially arranged physical sectors PS(0)-PS(7). The physical pages belonging to the same physical block can be individually written but have to be erased all together. To be specific, physical block is the smallest erasing unit. Namely, each physical block contains the least number of memory cells that are erased together. Physical page is the smallest programming unit. Namely, physical page is the smallest unit for writing data. However, in another exemplary embodiment of the invention, the smallest unit for writing data may also be physical sector or any other unit. Each physical sector includes a user data bit area and a redundant bit area, wherein the user data bit area is used for storing user data, and the redundant bit area is used for storing system data (for example, error checking and correcting (ECC) codes). For example, the user data bit area of each physical sector has a capacity of 1 kilobyte (K). Accordingly, each physical page can store user data of 8K.

In the present exemplary embodiment, each physical block is composed of 128 physical pages. However, the invention is not limited thereto, and each physical block may also be composed of 64, 256, or any other number of physical pages. Similarly, even though each physical page is composed of 8 physical sectors in the present exemplary embodiment, the invention is not limited thereto.

The re-writable non-volatile memory module 106 may be a multi level cell (MLC) NAND flash memory module. However, the invention is not limited thereto, and the re-writable non-volatile memory module 106 may also be a single level cell (SLC) NAND flash memory module, any other flash memory module, or any memory module having the same characteristics.

Figure 4:
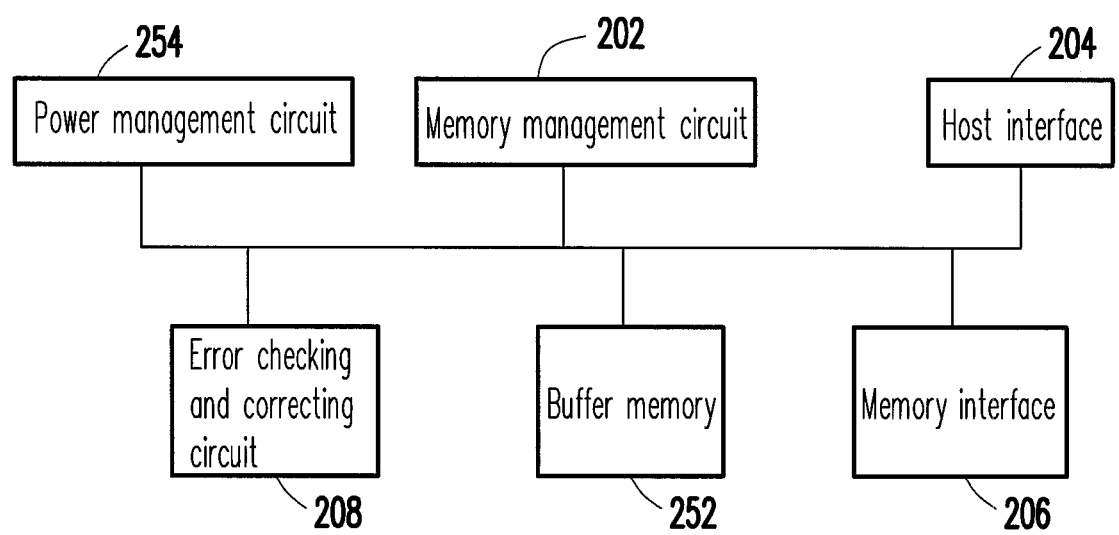
FIG. 4 is a schematic block diagram of a memory controller according to an exemplary embodiment of the invention.

FIG. 4 is a schematic block diagram of a memory controller according to an exemplary embodiment of the invention.

Referring to FIG. 4, the memory controller 104 includes a memory management circuit 202, a host interface 204, a memory interface 206, and an error checking and correcting circuit 208.

The memory management circuit 202 controls the overall operation of the memory controller 104. To be specific, the memory management circuit 202 has a plurality of control instructions, and when the memory storage apparatus 100 is in operation, the control instructions are executed to carry out various data operations.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage apparatus 100 is in operation, the control instructions are executed by the microprocessor unit to carry out various data operations.

In another exemplary embodiment of the invention, the control instructions of the memory management circuit 202 may also be stored into a specific area of the re-writable non-volatile memory module 106 (for example, the system area exclusively used for storing system data in a non-volatile memory module) as program codes. In addition, the memory management circuit 202 has a microprocessor unit (not shown), a ROM (not shown), and a RAM (not shown). In particular, the ROM has driver codes, and when the memory controller 104 is enabled, the microprocessor unit first executes the driver codes to load the control instructions from the re-writable non-volatile memory module 106 into the RAM of the memory management circuit 202. Thereafter, the microprocessor unit runs the control instructions to carry out various data operations. Moreover, in yet another exemplary embodiment of the invention, the control instructions of the memory management circuit 202 may also be implemented in a hardware form.

The host interface 204 is coupled to the memory management circuit 202 and configured to receive and identify commands and data from the host system 1000. Namely, the commands and data received from the host system 1000 are transmitted to the memory management circuit 202 through the host interface 204. In the present exemplary embodiment, the host interface 204 complies with the SATA standard. However, the invention is not limited thereto, and the host interface 204 may also complies with the PATA standard, the IEEE 1394 standard, the PCI express standard, the USB standard, the SD standard, the MS standard, the MMC standard, the CF standard, the IDE standard, or any other suitable data transmission standard.

The memory interface 206 is coupled to the memory management circuit 202 and configured to access the re-writable non-volatile memory module 106. Namely, data to be written into the re-writable non-volatile memory module 106 is converted by the memory interface 206 into a format acceptable to the re-writable non-volatile memory module 106.

The error checking and correcting circuit 208 is coupled to the memory management circuit 202 and configured to execute an error checking and correcting procedure to ensure data accuracy. To be specific, when a write command is executed, the error checking and correcting circuit 208 generates a corresponding ECC code for the data corresponding to the write command, and the memory management circuit 202 writes the data and the corresponding ECC code into the re-writable non-volatile memory module 106. Subsequently, when the memory management circuit 202 reads the data from the re-writable non-volatile memory module 106, it also reads the ECC code corresponding to the data, and the error checking and correcting circuit 208 executes the error checking and correcting procedure on the data according to the ECC code. It should be mentioned that the number of error bits that can be corrected by the error checking and correcting circuit 208 is in direct proportion to the length of the ECC code it generates. Namely, the more error bits the error checking and correcting circuit 208 is designed to correct, the more storage space is required for storing the ECC code it generates. As described above, the redundant bit area for storing ECC codes has a fixed capacity (which varies with different types of re-writable non-volatile memory modules). Thus, the error correcting algorithm implemented in the error checking and correcting circuit 208 is limited by the type of the re-writable non-volatile memory module 106. For example, in the present exemplary embodiment, the error checking and correcting circuit 208 can correct at most 40 error bits. Namely, the error checking and correcting circuit 208 can always correct the error bits successfully as long as the number of the error bits in the data does not exceed 40.

In an exemplary embodiment of the invention, the memory controller 104 further includes a buffer memory 252. The buffer memory 252 is coupled to the memory management circuit 202 and configured to temporarily store data and commands from the host system 1000 or data from the re-writable non-volatile memory module 106.

In an exemplary embodiment of the invention, the memory controller 104 further includes a power management circuit 254. The power management circuit 254 is coupled to the memory management circuit 202 and configured to control the power supply of the memory storage apparatus 100.

Figure 5:
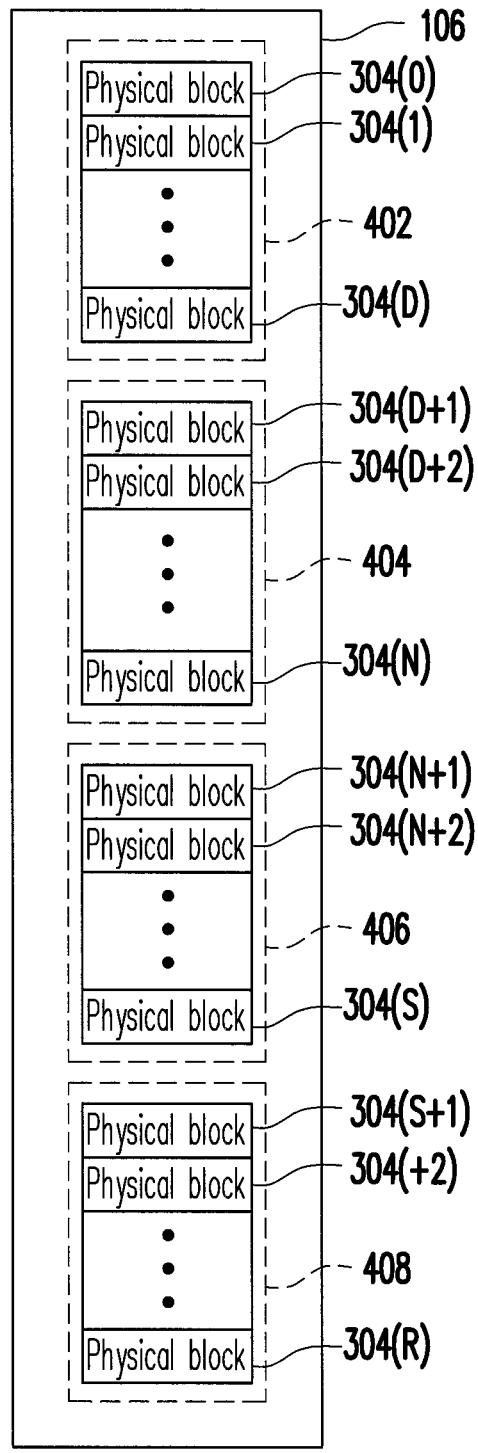
FIG. 5 is a diagram of managing the physical blocks in a re-writable non-volatile memory module according to an exemplary embodiment of the invention.

FIG. 5 is a diagram of managing the physical blocks in a re-writable non-volatile memory module according to an exemplary embodiment of the invention.

It should be understood that the terms, such as "get", "select", "replace", "group", and "substitute", used for describing the operations performed on the physical blocks of the non-volatile memory module 106 refer only to logical operations. Namely, the actual positions of the physical blocks in the non-volatile memory module 106 are not changed. Instead, the physical blocks of the non-volatile memory module 106 are only logically operated.

Referring to FIG. 4, the memory management circuit 202 logically groups the physical blocks 304(0)-304(R) of the non-volatile memory module 106 into a data area 402, a free area 404, a system area 406, and a replacement area 408.

The physical blocks in the data area 402 and the free area 404 are used for storing data from the host system 1000. To be specific, the physical blocks in the data area 402 already contain data, while the physical blocks in the free area 404 are used for substituting the physical blocks in the data area 402. Thus, the physical blocks in the free area 404 are either blank or available physical blocks (i.e., no data is recorded therein or data recorded therein is marked as invalid data). Namely, the physical blocks in the free area 404 have been erased, or when a physical block is selected from the free area 404 for storing data, the selected physical block is erased before it is used for storing data. Thus, the physical blocks in the free area 404 are available physical blocks.

The physical blocks logically belonging to the system area 406 are used for recording system data, such as the manufacturer and model of the memory chip, the number of physical blocks in the memory chip, and the number of physical pages in each physical block.

The physical blocks logically belonging to the replacement area 408 are replacement physical blocks. For example, when the non-volatile memory module 106 is manufactured, 4% of its physical blocks are reserved for replacement purpose. Namely, when the physical blocks in the data area 402, the free area 404, and the system area 406 are damaged, the physical blocks in the replacement area 408 are used for replacing the damaged physical blocks (i.e., bad blocks). Thus, if there are still normal physical blocks in the replacement area 408 and a physical block is damaged, the memory management circuit 202 selects a normal physical block from the replacement area 408 to replace the damaged physical block. If there is no more normal physical block in the replacement area 408 and a physical block is damaged, the memory management circuit 202 announces that the entire non-volatile memory storage apparatus 100 enters a write-protect status and cannot be used for writing data.

In particular, the numbers of the physical blocks in the data area 402, the free area 404, the system area 406, and the replacement area 408 vary with the specification of the memory module. In addition, during the operation of the non-volatile memory storage apparatus 100, the physical blocks associated with the data area 402, the free area 404, the system area 406, and the replacement area 408 dynamically changes. For example, when a physical block in the free area 404 is damaged therefore is replaced by a physical block in the replacement area 408, the physical block originally in the replacement area 408 is associated with the free area 404.

Particularly, in the present exemplary embodiment, the memory management circuit 202 identifies non-used sectors in the physical blocks and skips the identified non-used sectors while writing data into the non-volatile memory module 106 in unit of physical pages (i.e., does not store the data received to be written by the host system 1000 into the non-volatile memory module 106 into the non-used sectors).

To be specific, one of the physical blocks in the non-volatile memory module 106 is used for storing bad sector information, wherein the bad sector information records the information of unusable sectors (i.e., non-used sectors) in the non-volatile memory module 106. For example, if the bad sector information records that the physical sector PS(5) is an non-used sector, the memory management circuit 202 does not use the physical sector PS(5) for writing valid data. Namely, none of the physical sectors PS(5) of the physical pages in the non-volatile memory module 106 is used for storing valid data. In the present exemplary embodiment, when the memory management circuit 202 determines that a sector for writing data is a non-used sector, it skips the sector or writes an invalid data into the sector.

For example, when the memory controller 104 is about to write a plurality of sector data streams (i.e., data having a quantity of a physical sector) into the physical page PP(0) of the physical block 304(0), the memory management circuit 202 sequentially writes the sector data into the physical sector PS(0), the physical sector PS(1), the physical sector PS(2), the physical sector PS(3), the physical sector PS(4), the physical sector PS(6), and the physical sector PS(7) of the physical page PP(0). Herein the memory controller 104 may write the sector data into the physical page PP(0) by using a program command containing a skip command.

Figure 6:
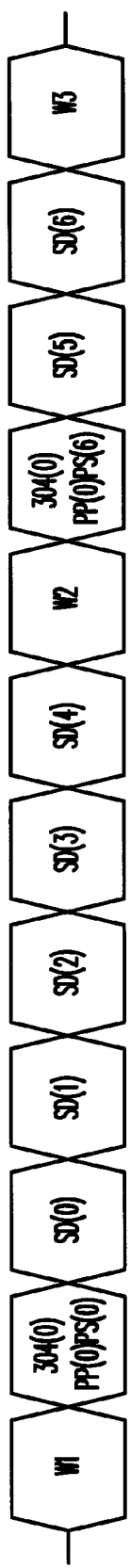
FIG. 6 is a diagram illustrating an example of program commands according to an exemplary embodiment of the invention.

FIG. 6 is a diagram illustrating an example of program commands according to an exemplary embodiment of the invention.

Referring to FIG. 6, it is assumed that the sector data SD(0)-SD(6) is about to be written into the physical sectors PS(0)-PS(4) and PS(6)-PS(7) of the physical page PP(0) of the physical block 304(0) (i.e., the physical sector PS(5) is skipped). The memory management circuit 202 of the memory controller 104 issues a command composed of strings "command W1", "physical address", "data", "command W2", and "command W3" to the re-writable non-volatile memory module 106.

To be specific, the memory management circuit 202 instructs the re-writable non-volatile memory module 106 to input the stream data to be programmed through "command W1", instructs the re-writable non-volatile memory module 106 that the address for programming the data is the physical sector PS(0) of the physical page PP(0) of the physical block 304(0) through "304(0)PP(0)PS(0)", instructs the re-writable non-volatile memory module 106 about the sector data SD(0)-SD(4) to be programmed (i.e., the sector data SD(0)-SD(4) will be written into the physical sectors PS(0)-PS(4)) through "SD(0)-SD(4)", instructs the re-writable non-volatile memory module 106 to jump to another physical address through "command W2", instructs the re-writable non-volatile memory module 106 to jump to the physical sector PS(6) of the physical page PP(0) of the physical block 304(0) to program the data through "304(0)PP(0)PS(6)", instructs the re-writable non-volatile memory module 106 that the sector data SD(5)-SD(6) is to be programmed (i.e., the sector data SD(5)-SD(6) will be written into the physical sectors PS(6)-PS(7)) through "SD(5)-SD(6)", and instructs the re-writable non-volatile memory module 106 to start programming the data through "command W3". Thus, the non-volatile memory module 106 programs the sector data into the physical page PP(0) of the physical block 304(0) and skips the physical sector PS(5) according to this program command.

It should be mentioned that as described above, the physical blocks in the data area 402 and the free area 404 are alternatively used for storing data written by the host system 1000. In the present exemplary embodiment, the memory management circuit 202 configures logical sectors for the host system 1000 so that the host system 1000 can access the alternatively used physical blocks smoothly. In particular, the memory management circuit 202 groups logical addresses (herein also referred to as logical sectors) into a plurality of logical pages and groups the logical pages into a plurality of logical blocks. In addition, the memory management circuit 202 establishes a logical block-physical block mapping table to record the mapping relationship between the physical blocks, which are used for storing data belonging to the logical blocks, and the logical blocks.

Figure 7:
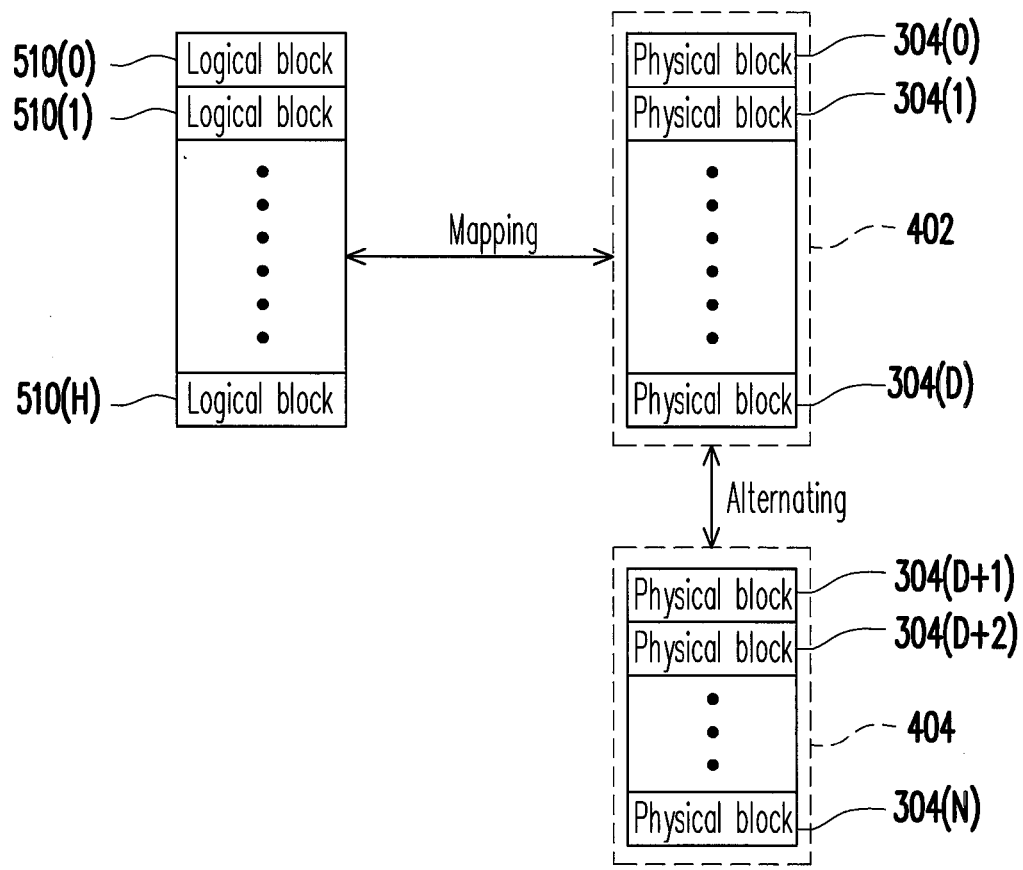
FIG. 7 is a diagram illustrating the mapping relationship between logic blocks and physical blocks according to an exemplary embodiment of the invention.

FIG. 7 is a diagram illustrating the mapping relationship between logic blocks and physical blocks according to an exemplary embodiment of the invention.

Referring to FIG. 7, the logical blocks 510(0)-510(H) are mapped to the physical blocks in the data area 402. For example, when the non-volatile memory storage apparatus 100 is formatted by the operating system of the host system 1000 with a file system (for example, FAT 32), the logical blocks 510(0)-510(H) are respectively mapped to the physical blocks 304(0)-304(D) in the data area 402. Namely, one logical block is mapped to one physical block in the data area 402. Subsequently, the mapping relationship in the logical block-physical block mapping table is updated when physical blocks are selected from the free area 404 for writing data and substituting physical blocks in the data area 402. For example, when the logical block 510(0) is mapped to the physical block 304(0) and the memory controller 104 receives a write command from the host system 1000 therefore is about to write data into the logical sectors of the logical block 510(0), the memory management circuit 202 identifies that the logical block 510(0) is currently mapped to the physical block 304(0) according to the logical block-physical block mapping table and selects the physical block 304(D+1) from the free area 404 as a substitute physical block to substitute the physical block 304(0). For example, the memory management circuit 202 writes valid data stored in the physical block 304(0) and the new data into the physical block 304(D+1), erases the physical block 304(0) and associated the erased physical block 304(0) to the free area 404, and re-maps the logical block 510(0) to the physical block 304(D+1) in the logical block-physical block mapping table(i.e., the physical block 304(D+1) is associated with the data area 402.

In the present exemplary embodiment, while configuring the logical sectors and grouping the logical sectors into logical pages corresponding to physical pages, the memory management circuit 202 does not configure any logical sector for the non-used physical sectors. Accordingly, the capacity of each logical page is smaller than that of the corresponding physical page. Namely, the capacity of a logical page is equal to the capacity of a physical page minus the capacity of the non-used sector of the physical page.

Figure 8:
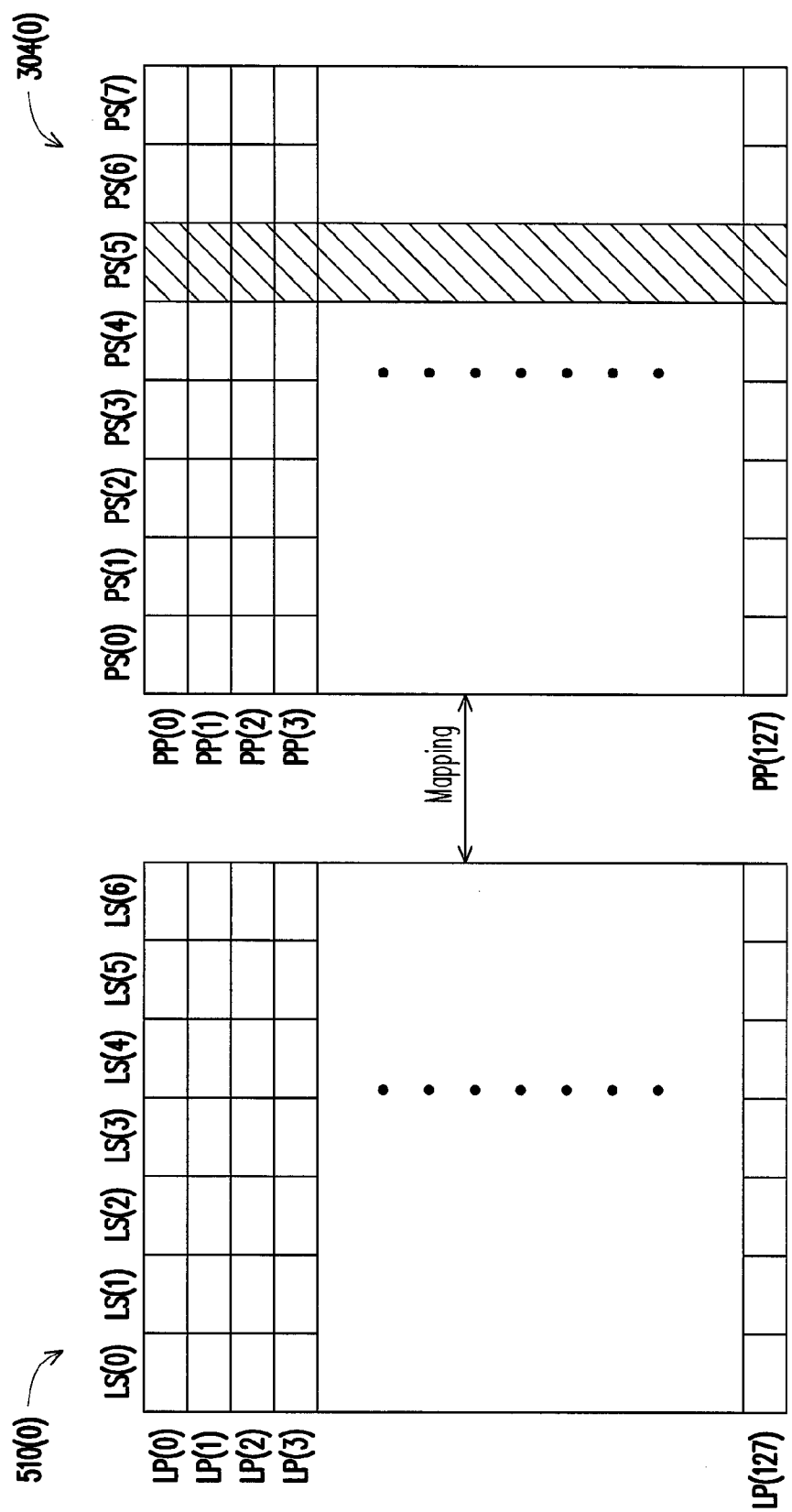
FIG. 8 is a diagram illustrating an example of mapping between logical pages of a logical block and data bit areas of physical pages of a physical block according to an exemplary embodiment of the invention.

FIG. 8 is a diagram illustrating an example of mapping between logical pages of a logical block and data bit areas of physical pages of a physical block according to an exemplary embodiment of the invention. Herein it is assumed that the logical block 510(0) is currently mapped to the physical block 304(0), and the mapping relationship between logical and physical pages will be explained by taking the logical block 510(0) and the physical block 304(0) as examples. The mapping relationship explained herein is applicable to the logical pages of any logical block and the physical pages of any physical block in the present exemplary embodiment.

Referring to FIG. 8, if the bad sector information records that the physical sector PS(5) is a non-used sector (as indicated by the dotted line), the memory management circuit 202 only groups 7 logical sectors into a logical page. Thus, each logical page in the logical block 510(0) contains the logical sectors LS(0)-LS(6). Besides, in the mapping relationship between the logical sectors of a logical page and the physical sectors of a physical page, the logical sector LS(0) is mapped to the physical sector PS(0), the logical sector LS(1) is mapped to the physical sector PS(2), the logical sector LS(3) is mapped to the physical sector PS(3), the logical sector LS(4) is mapped to the physical sector PS(4), the logical sector LS(5) is mapped to the physical sector PS(6), and the logical sector LS(6) is mapped to the physical sector PS(7). Namely, data to be written into the logical sector LS(5) by the host system 1000 is written into the physical sector PS(6), and data to be written into the logical sector LS(6) by the host system 1000 is written into the physical sector PS(7), so that the physical sector PS(5) is skipped.

Figure 9:
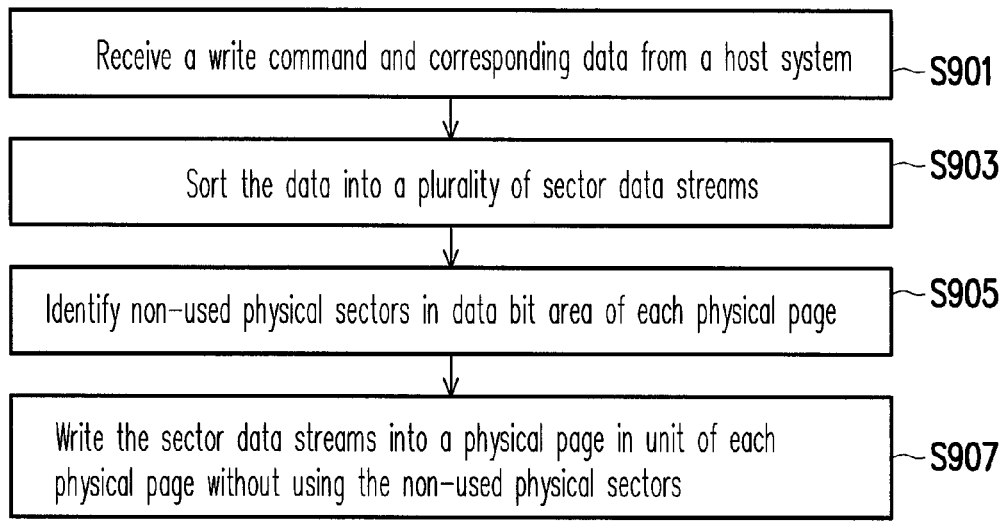
FIG. 9 is a flowchart of a data writing method according to an exemplary embodiment of the invention.

FIG. 9 is a flowchart of a data writing method according to an exemplary embodiment of the invention, wherein the steps of writing data into a physical page (referred to as a first physical page thereinafter) are illustrated.

Referring to FIG. 9, in step S901, the memory management circuit 202 receives a write command and corresponding data from the host system 1000. The write command contains the logical sectors for writing the data and the memory management circuit 202 identifies the logical page (referred to as a first logical page thereinafter) corresponding to the logical sectors. Then, in step S903, the memory management circuit 202 sorts the data into a plurality of sector data streams. For example, the memory management circuit 202 arranges the data into sector data with a predetermined ECC frame.

Next, in step S905, the memory management circuit 202 identifies the non-used physical sectors (i.e., non-used sectors) in the data bit area of each physical page.

After that, in step S907, the memory management circuit 202 writes a plurality of sector data streams into the first physical page in unit of each physical page without using the non-used physical sectors. Particularly, in step S907, the sector data is not written into the non-used sectors of the first physical page. For example, as shown in FIG. 6 and FIG. 8, the memory management circuit 202 skips the non-used sectors by using the command W2 according to the mapping relationship between the first logical page and the first physical page, so as to write the sector data into the physical block in unit of physical pages.

As described above, during the operation of the memory storage apparatus 100, the memory management circuit 202 of the memory controller 104 identifies non-used sectors according to the bad sector information and skips the non-used sectors while writing data in unit of physical pages. Below, the establishment of the bad sector information will be described according to an exemplary embodiment of the invention. However, this is only an example and the invention is not limited thereto.

When the memory storage apparatus 100 is just manufactured and tested, the memory management circuit 202 tests the physical pages of the physical blocks in the non-volatile memory module 106 to generate a damaged sector distribution table. To be specific, the memory management circuit 202 writes test data into the physical sectors of test physical pages, wherein the test physical pages may be all the physical pages of the non-volatile memory module 106 or randomly selected from the physical pages of the non-volatile memory module 106 through a sampling technique.

Thereafter, the memory management circuit 202 reads the data written into the physical sectors of the test physical pages, and the error checking and correcting circuit 208 performs an error checking and correcting procedure on the data read from each physical sector to determine whether the data contains any uncorrectable error bit. When the data does contain uncorrectable error bits, the memory management circuit 202 writes test data again to determine whether the physical sector is defective.

For example, neighboring physical sectors may be affected when data is programmed. Thus, while storing data into the physical sector S(0) and the physical sector S(1), the memory management circuit 202 only writes the test data stream into the physical sector S(0) to determine whether the data stored in the physical sector S(0) contains any uncorrectable error bit and only writes the test data stream into the physical sector S(1) to determine whether the data stored in the physical sector S(1) contains any uncorrectable error bit, so as to determine whether the physical sector S(0) and the physical sector S(1) are defective.

If the data still contains uncorrectable error bits after foregoing testing and re-testing procedure is performed, the physical sectors storing the data are marked as damaged physical sectors. After that, the memory management circuit 202 determines a distribution status of the damaged physical sectors in the test physical pages to generate the damaged sector distribution table.

In the present exemplary embodiment, the memory management circuit 202 executes different writing tests according to the damaged sector distribution table to identify the non-used sectors.

To be specific, as described above, regarding the management of the bad physical blocks in the non-volatile memory module, when the data stored in a physical block contains uncorrectable error bits, the physical block is marked as a bad physical block and will not be used. Herein the memory management circuit 202 selectively uses part of the physical sectors in each physical page for writing data according to the damaged sector distribution table by using a try and error technique, so as to identify the non-used sectors.

For example, assuming that the memory management circuit 202 only writes test data into the physical sectors PS(0), PS(1), PS(2), PS(3), PS(4), PS(6), and PS(7) of each physical page and accordingly 50 physical blocks are determined to be bad physical blocks, the usable capacity of the data bit areas of the re-writable non-volatile memory module 106 when only the physical sectors PS(0), PS(1), PS(2), PS(3), PS(4), PS(6), and PS(7) of each physical page are used is determined to be 447552K (i.e., 2 k(bytes)×7/8)×128(pages)×(2048−50) blocks). This example is applicable to a storage apparatus having 2 k pages and 2048 blocks.

Assuming that the memory management circuit 202 only writes test data into the physical sectors PS(1), PS(2), PS(3), PS(4), PS(6), and PS(7) of each physical page and accordingly 40 physical blocks are determined to be bad physical blocks, the usable capacity of the data bit areas of the re-writable non-volatile memory module 106 when only the physical sectors PS(1), PS(2), PS(3), PS(4), PS(6), and PS(7) of each physical page are used is determined to be 383616K (i.e. 2 k(bytes)×6/8)×128(pages)×(2048−50)blocks).

Accordingly, the memory management circuit 202 can calculate the usable capacities corresponding to different writing tests. For example, the memory management circuit 202 can select a data writing manner corresponding to the maximum usable capacity and thereby decides the non-used sectors.

In the present exemplary embodiment, the memory management circuit 202 stores the information of the non-used sectors into one of the physical blocks of the non-volatile memory module 106 as the bad sector information. The physical block storing the bad sector information may be a physical block in the system area 406. Or, the memory management circuit 202 may also store the bad sector data into one of the physical blocks in the free area 404 and mark the physical block as a bad physical block so that the data stored therein won't be overwritten.

Figure 10:
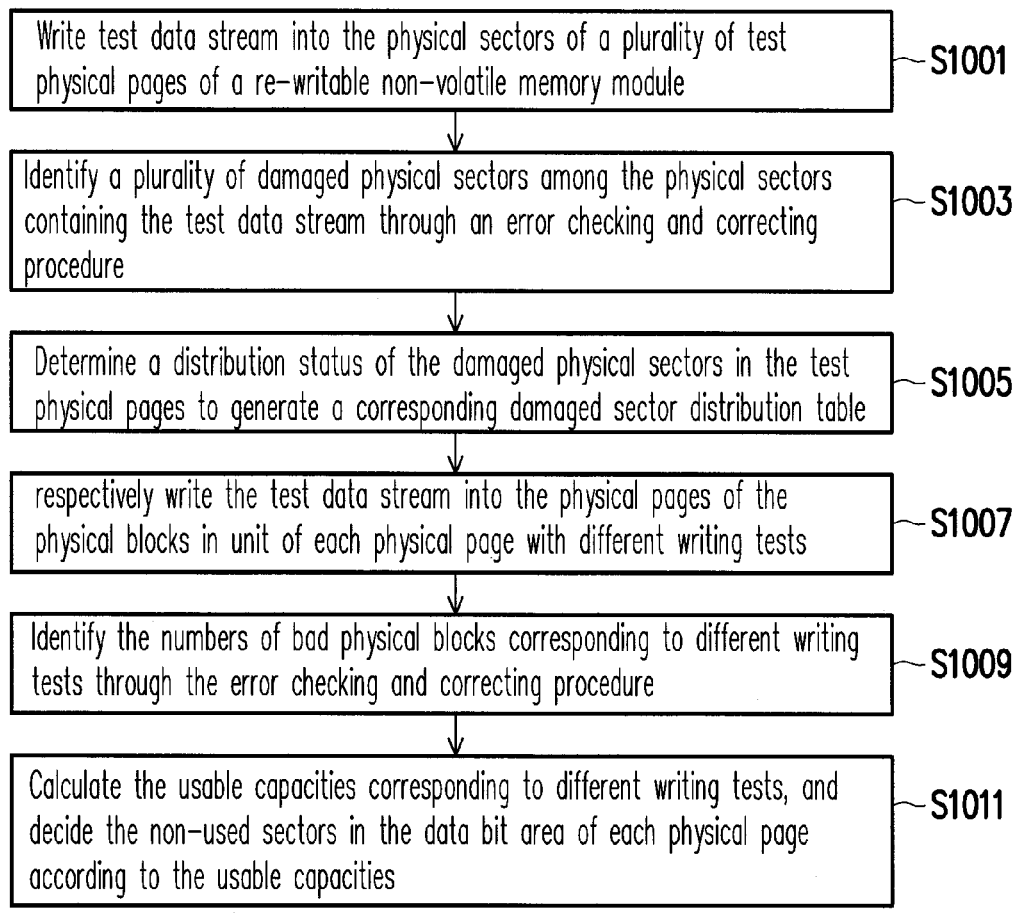
FIG. 10 is a flowchart of deciding a non-used sector in according to an exemplary embodiment of the invention.

FIG. 10 is a flowchart of deciding a non-used sector according to an exemplary embodiment of the invention.

Referring to FIG. 10, in step S1001, the test data stream is written into the physical sectors of a plurality of test physical pages of the re-writable non-volatile memory module 106. As described above, the test physical pages may be all or part of the physical pages of the re-writable non-volatile memory module 106.

Then, in step S1003, a plurality of damaged physical sectors among the physical sectors written with the test data stream is identified through an error checking and correcting procedure. Besides, in step S1005, a distribution status of the damaged physical sectors in the test physical pages is determined to generate a corresponding damaged sector distribution table.

Next, in step S1007, the test data stream is respectively written into the physical pages of the physical blocks through different writing tests in unit of each physical page. Besides, in step S1009, the numbers of bad physical blocks corresponding to different writing tests are respectively identified through the error checking and correcting procedure.

After that, in step S1011, the usable capacities corresponding to different writing tests are calculated, and the non-used sectors in the data bit area of each physical page are decided according to the usable capacities. For example, a maximum usable capacity among the usable capacities is identified and the non-used sectors of each physical page are decided according to the maximum usable capacity.

In summary, exemplary embodiments of the invention provide a data writing method and a memory controller and a memory storage apparatus using the same, wherein normal storage space of a re-writable non-volatile memory module can be effectively used so that those re-writable non-volatile memory modules which are considered as unusable products can be re-used. The previously described exemplary embodiments of the present invention have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data writing method for a re-writable non-volatile memory module, wherein the re-writable non-volatile memory module has a data area and a free area, the data area is used for storing data, the free area is used for writing data and substituting the data area, the free area has a plurality of physical writing units, the data writing method comprising:

dividing each of the physical writing units into a data bit area and a redundant bit area, wherein each of the data bit areas comprises a plurality of physical writing segments;

identifying at least one of the physical writing segments in the data bit area of each of the physical writing units as at least one non-used segment, wherein at least one of the at least one non-used segment in one of the physical writing units is a good physical writing segment; and writing a plurality of segment data streams into the physical writing units, wherein the non-used segments of the physical writing units are not used for writing the segment data.

2. The data writing method according to claim 1 further comprising:
testing the physical writing segments of the physical writing units to generate a damaged segment distribution table;
deciding the at least one non-used segment among the physical writing segments of each of the physical writing units according to the damaged segment distribution table; and
storing a bad segment information into one of the physical writing units, wherein the bad segment information comprises information of the at least one non-used segment among the physical writing segments of each of the physical writing units,
wherein the step of identifying the at least one non-used segment among the physical writing segments of each of the physical writing units comprises:
identifying the at least one non-used segment among the physical writing segments of each of the physical writing units according to the bad segment information.

3. The data writing method according to claim 2, wherein the step of testing the physical writing segments of the physical writing units to generate the damaged segment distribution table comprises:
writing a test data stream into each of the physical writing segments of a plurality of test physical writing units among the physical writing units;
executing an error checking and correcting procedure to identify a plurality of damaged physical writing segments among the physical writing segments written with the test data stream; and
determining a distribution status of the damaged physical writing segments in the test physical writing units to generate the damaged segment distribution table.

4. The data writing method according to claim 1 further comprising:
configuring a plurality of logical writing units to map to a portion of the physical writing units,
wherein a capacity of each of the logical writing units is equal to a capacity of each of the physical writing units minus a capacity of the non-used segment of each of the physical writing units.

5. A data writing method, adaptable to a re-writable non-volatile memory module, wherein the re-writable non-volatile memory module has a plurality of physical blocks, each of the physical blocks has a plurality of physical pages, the data writing method comprising:
dividing each of the physical pages into a data bit area and a redundant bit area, where each of the data bit areas comprises a plurality of physical sectors;
identifying at least one of the physical sectors in the data bit area of each of the physical pages as at least one non-used sector, wherein at least one of the at least one non-used sector in one of the physical pages is a good physical sector; and
writing a plurality of sector data streams into a first physical page among the physical pages in unit of each of the physical pages, wherein the non-used sector among the physical sectors of the first physical page is not used for writing the sector data.

6. The data writing method according to claim 5 further comprising:
testing the physical pages of the physical blocks to generate a damaged sector distribution table;
deciding the at least one non-used sector among the physical sectors in the data bit area of each of the physical pages according to the damaged sector distribution table; and
storing a bad sector information into one of the physical blocks, wherein the bad sector information comprises information of the at least one non-used sector among the physical sectors in the data bit area of each of the physical pages,
wherein the step of identifying the at least one non-used sector among the physical sectors in the data bit area of each of the physical pages comprises:
identifying the at least one non-used sector among the physical sectors in the data bit area of each of the physical pages according to the bad sector information.

7. A memory controller for controlling a re-writable non-volatile memory module, wherein the re-writable non-volatile memory module has a plurality of physical blocks, each of the physical blocks has a plurality of physical pages, the memory controller comprising:
a host interface, configured to couple to a host system;
a memory interface, configured to couple to the re-writable non-volatile memory module; and
a memory management circuit, coupled to the host interface and the memory interface and dividing each of the physical pages into a data bit area and a redundant bit area, and each of the data bit areas comprises a plurality of physical sectors,
wherein the memory management circuit identifies at least one of the physical sectors in the data bit area of each of the physical pages as at least one non-used segment, wherein at least one of the at least one non-used sector in one of the physical pages is a good physical sector,
wherein the memory management circuit further writes a plurality of sector data streams into a first physical page among the physical pages in unit of each of the physical pages, wherein the non-used sector among the physical sectors in the data bit area of the first physical page is not used for writing the sector data.

8. The memory controller according to claim 7,
wherein the memory management circuit tests the physical pages of the physical blocks to generate a damaged sector distribution table,
wherein the memory management circuit decides the at least one non-used sector among the physical sectors in the data bit area of each of the physical pages according to the damaged sector distribution table,
wherein the memory management circuit stores a bad sector information into one of the physical blocks, wherein the bad sector information comprises information of the at least one non-used sector among the physical sectors in the data bit area of each of the physical pages,
wherein the memory management circuit identifies the at least one non-used sector among the physical sectors in the data bit area of each of the physical pages according to the bad sector information.

9. The memory controller according to claim 8 further comprising an error checking and correcting circuit,
wherein the memory management circuit writes a test data stream into each of the physical sectors of a plurality of test physical pages among the physical pages,
wherein the memory management circuit identifies a plurality of damaged physical sectors among the physical sectors written with the test data stream through the error checking and correcting circuit, wherein the memory management circuit determines a distribution status of the damaged physical sectors in the test physical pages to generate the damaged sector distribution table.

10. The memory controller according to claim 9, wherein the memory management circuit respectively writes the test data stream into the physical pages of the physical blocks in unit of each of the physical pages with a plurality of writing tests according to the damaged sector distribution table, and in each of the writing tests, the test data stream is written into a portion of the physical sectors of the physical pages of the physical blocks, wherein the memory management circuit respectively identifies a plurality of bad physical blocks among the physical blocks in the writing tests through the error checking and correcting circuit, wherein the memory management circuit respectively calculates a plurality of usable capacities corresponding to the writing tests according to the identified bad physical blocks, wherein the memory management circuit decides the at least one non-used sector among the physical sectors in the data bit area of each of the physical pages according to the usable capacities.

11. The memory controller according to claim 10, wherein the memory management circuit decides the at least one non-used sector among the physical sectors in the data bit area of each of the physical pages according to a maximum usable capacity among the usable capacities.

12. The memory controller according to claim 7, wherein the memory management circuit configures a plurality of logical pages to map to a portion of the physical pages, wherein the sector data belongs to a first logical page among the logical pages, and a capacity of the first logical page is equal to a capacity of the first physical page minus a capacity of the at least one non-used sector of the first physical page.

13. The memory controller according to claim 7, wherein the memory management circuit receives at least one data from the host system and sorts the data into the sector data.

14. A memory storage apparatus, comprising:

a connector, configured to couple to a host system;

a re-writable non-volatile memory module, having a plurality of physical blocks, wherein each of the physical blocks has a plurality of physical pages, each of the physical pages comprises a data bit area and a redundant bit area, and each of the data bit areas comprises a plurality of physical sectors; and a memory controller, coupled to the connector and the re-writable non-volatile memory module, wherein the memory controller identifies at least one of the physical sectors in the data bit area of each of the physical pages as at least one non-used segment, wherein at least one of the at least one non-used sector in one of the physical pages is a good physical sector, wherein memory controller further writes a plurality of sector data streams into a first physical page among the physical pages in unit of each of the physical pages, wherein the non-used sector among the physical sectors in the data bit area of the first physical page is not used for writing the sector data.

15. The memory storage apparatus according to claim 14, wherein the memory controller tests the physical pages of the physical blocks to generate a damaged sector distribution table, wherein the memory controller further decides the non-used sector among the physical sectors in the data bit area of each of the physical pages according to the damaged sector distribution table, wherein the memory controller further stores a bad sector information into one of the physical blocks, wherein the bad sector information comprises information of the at least one non-used sector among the physical sectors in the data bit area of each of the physical pages, wherein the memory controller identifies the at least one non-used sector among the physical sectors in the data bit area of each of the physical pages according to the bad sector information.

16. The memory storage apparatus according to claim 15, wherein the memory controller comprises an error checking and correcting circuit, wherein the memory controller writes a test data stream into each of the physical sectors of a plurality of test physical pages among the physical pages, wherein the memory controller identifies a plurality of damaged physical sectors among the physical sectors containing the test data stream through the error checking and correcting circuit, wherein the memory controller determines a distribution status of the damaged physical sectors in the test physical pages to generate the damaged sector distribution table.

17. The memory storage apparatus according to claim 16, wherein the memory controller respectively writes the test data stream into the physical pages of the physical blocks in unit of each of the physical pages with a plurality of writing tests according to the damaged sector distribution table, and in each of the writing tests, the test data stream is written into a portion of the physical sectors of the physical pages of the physical blocks, wherein the memory controller respectively identifies a plurality of bad physical blocks among the physical blocks in the writing tests through the error checking and correcting circuit, wherein the memory controller respectively calculates a plurality of usable capacities corresponding to the writing tests according to the identified bad physical blocks, wherein the memory controller decides the at least one non-used sector among the physical sectors in the data bit area of each of the physical pages according to the usable capacities.

18. The memory storage apparatus according to claim 17, wherein the memory controller decides the at least one non-used sector among the physical sectors in the data bit area of each of the physical pages according to a maximum usable capacity among the usable capacities.

19. The memory storage apparatus according to claim 14, wherein the memory controller configures a plurality of logical pages to map to a portion of the physical pages, wherein the sector data belongs to a first logical page among the logical pages, and a capacity of the first logical page is equal to a capacity of the first physical page minus a capacity of the at least one non-used sector of the first physical page.

20. The memory storage apparatus according to claim 14, wherein the memory controller receives at least one data from the host system and sorts the data into the sector data.

* * * * *